(12) United States Patent
Mohanty et al.

(10) Patent No.: US 10,141,183 B2
(45) Date of Patent: Nov. 27, 2018

(54) METHODS OF SPIN-ON DEPOSITION OF METAL OXIDES

(71) Applicant: Tokyo Electron Limited, Tokyo (JP)

(72) Inventors: Nihar Mohanty, Clifton Park, NY (US); Lior Huli, Delmar, NY (US); Jeffrey Smith, Clifton Park, NY (US); Richard Farrell, Nassau, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/416,645

(22) Filed: Jan. 26, 2017

(65) Prior Publication Data

US 2017/0221704 A1    Aug. 3, 2017

Related U.S. Application Data

(60) Provisional application No. 62/288,253, filed on Jan. 28, 2016.

(51) Int. Cl.
*H01L 21/02* (2006.01)
*C23C 16/455* (2006.01)
*H01L 21/033* (2006.01)

(52) U.S. Cl.
CPC .. *H01L 21/02359* (2013.01); *C23C 16/45525* (2013.01); *H01L 21/0234* (2013.01); *H01L 21/02175* (2013.01); *H01L 21/02186* (2013.01); *H01L 21/02282* (2013.01); *H01L 21/02307* (2013.01); *H01L 21/02315* (2013.01); *H01L 21/02334* (2013.01); *H01L 21/0332* (2013.01)

(58) Field of Classification Search
None
See application file for complete search history.

(56) References Cited

U.S. PATENT DOCUMENTS

| | | |
|---|---|---|
| 6,730,597 B1 | 5/2004 | Lu et al. |
| 7,686,978 B2 | 3/2010 | Petrov et al. |
| 8,067,887 B2 | 11/2011 | Sant et al. |

(Continued)

FOREIGN PATENT DOCUMENTS

KR    10-2005-0064265 A    6/2005

OTHER PUBLICATIONS

International Search Report and Written Opinion dated Apr. 28, 2017 in PCT/US2017/015097.

(Continued)

*Primary Examiner* — Angel Roman
(74) *Attorney, Agent, or Firm* — Oblon, McClelland, Maier & Neustadt, L.L.P.

(57) ABSTRACT

Techniques herein provide methods for depositing spin-on metal materials for creating metal hard mask (MHM) structures without voids in the deposition. This includes effective spin-on deposition of TiOx, ZrOx, SnOx, HFOx, TaOx, et cetera. Such materials can help to provide differentiation of material etch resistivity for differentiation. By enabling spin-on metal hard mask (MHM) for use with a multi-line layer, a slit-based or self-aligned blocking strategy can be effectively used. Techniques herein include identifying a fill material to fill particular openings in a given relief pattern, modifying a surface energy value of surfaces within the opening such that a contact angle value of an interface between the fill material in liquid form and the sidewall or floor surfaces enables gap-free or void-free filling.

16 Claims, 2 Drawing Sheets

(56) References Cited

U.S. PATENT DOCUMENTS

| | | |
|---|---|---|
| 8,287,766 B2 | 10/2012 | Petrov et al. |
| 8,465,850 B2 | 6/2013 | Petrov et al. |
| 2003/0176064 A1 | 9/2003 | Lu et al. |
| 2005/0062021 A1 | 3/2005 | Petrov et al. |
| 2005/0196969 A1* | 9/2005 | Gunner ............... H01L 51/0005 438/725 |
| 2005/0239295 A1 | 10/2005 | Wang et al. |
| 2005/0269550 A1 | 12/2005 | Petrov et al. |
| 2009/0072713 A1 | 3/2009 | Sant et al. |
| 2011/0039061 A1* | 2/2011 | Fedynyshyn ....... B81C 1/00031 428/119 |
| 2011/0180761 A1 | 7/2011 | Petrov et al. |
| 2012/0214094 A1* | 8/2012 | Mikoshiba .......... H01L 21/0337 430/14 |
| 2015/0187565 A1* | 7/2015 | Su ....................... H01L 21/0276 438/703 |
| 2016/0013041 A1* | 1/2016 | Liu ..................... H01L 21/0212 438/703 |

OTHER PUBLICATIONS

Combined Office Action and Search Report dated Nov. 23, 2017 in Taiwanese Patent Application No. 106103428 (with English language translation).

* cited by examiner

METHODS OF SPIN-ON DEPOSITION OF METAL OXIDES

CROSS REFERENCE TO RELATED APPLICATIONS

The present application claims the benefit of U.S. Provisional Patent Application No. 62/288,253, filed on Jan. 28, 2016, entitled "Methods of Spin-on Deposition of Metal Oxides," which is incorporated herein by reference in its entirety.

BACKGROUND OF THE INVENTION

Techniques herein relate to scaling and patterning of semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure to actinic radiation through a reticle (and associated optics) onto the radiation-sensitive material using, for example, a photo-lithography system. This exposure can then be followed by the removal of irradiated regions of the radiation-sensitive material (as in the case of positive photoresist), or non-irradiated regions (as in the case of negative resist) depending on a developing solvent used. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

In order to maintain pitch scaling, back end of line (BEOL) trench patterning at N7 (node 7) and beyond must implement sub-36 nm pitch patterning. Although patterning this relatively small pitch can be challenging, it can be achieved by a variety of methods including EUV 13.5 nm lithography, self-aligned double patterning (SADP), 193 nm self-aligned quadruple patterning (SAQP) or via directed self-assembly (DSA). One useful technique in trench patterning processes is an area-selective blocking process where relatively long lines are cut into chains or line ends cut, et cetera, to form a final desired trench layout. As pitches get smaller, overlay requirements of such a block pattern go beyond the capability of the lithographic tools. This is a major challenge to overcome to continue pitch scaling in the BEOL fabrication.

Self-aligned blocking (SAB) techniques can enable overcoming patterning challenges at smaller nodes. The concept of SAB is that unmanageable overlay requirements are traded for a block pattern overlay with a more manageable etch selectivity challenge. For example, a multi-line layer is formed with alternating lines of different materials. These materials are different in that one or more of these materials can be selectively etched without etching remaining materials. When an etch mask is formed over this multi-line layer, and this etch mask has a relatively large opening uncovering multiple lines of material from the multi-line layer, tuning a given etch process to target one of these materials means that the etch mask opening is essentially further narrowed so that combining the etch mask opening with the multi-line layer (with at least one material removed) effectively creates a combined, sub-resolution etch mask for pattern transfer into an underlying layer. Such patterning can be made especially useful if used with spin-on metal hard mask (MHM) materials.

Techniques herein provide methods for depositing spin-on metal materials for creating metal hard mask (MHM) structures. This includes effective spin-on deposition of TiOx, ZrOx, SnOx, HFOx, TaOx, et cetera. Such materials can help to provide differentiation of etch resistivities which is referred to as providing different "colors" of a multi-line layer. By enabling spin-on metal hard mask (MHM) for use with a multi-line layer, multiple color decomposition is achieved on a given pattern, which enables a slit-based or self-aligned blocking strategy. Techniques herein include identifying a fill material to fill particular openings in a given relief pattern, modifying a surface energy value such that a contact angle value of an interface between the fill material in liquid form and the sidewall surfaces enables gap free filling.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
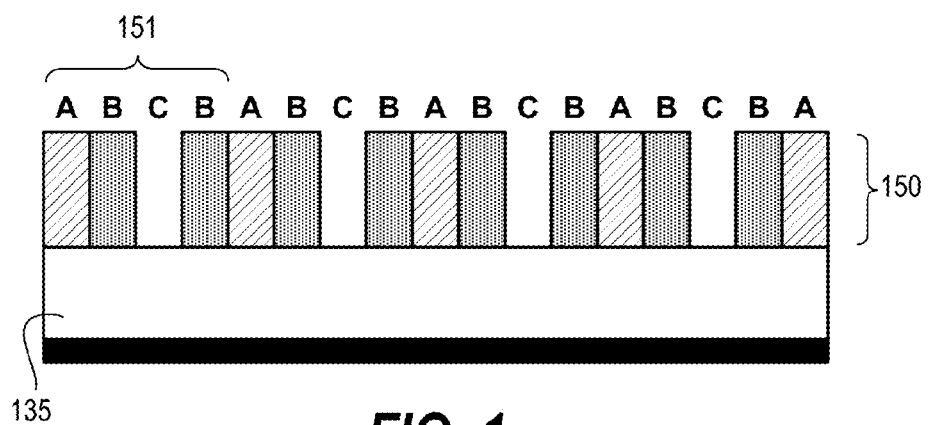
FIG. 1 is a cross-sectional schematic view of an example substrate segment showing a process flow according to embodiments disclosed herein.

Techniques herein provide methods for depositing spin-on metal materials for creating metal hard mask (MHM) structures. This includes effective spin-on deposition of TiOx, ZrOx, SnOx, HFOx, TaOx, et cetera. Such materials can help to provide differentiation of etch resistivities which is referred to as providing different "colors" of a multi-line layer. By enabling spin-on metal hard mask (MHM) for use with a multi-line layer, multiple color decomposition is achieved on a given pattern, which enables a slit-based or self-aligned blocking strategy.

A challenge during this spin-on metal oxide (MeOx) integration is gap fill. Filling the gaps for the sub-18 nm space in SAQP pattern, with aspect ratios reaching 5-6:1, is significantly challenging. Techniques herein, however, resolve some of the challenges in advanced node narrow pitch back end of line (BEOL) trench patterning.

Techniques herein resolve the gap fill issue for the spin-on MeOx materials. By matching the surface energy of the solvent system that the MeOx material is deposited in, with the surface energy of the trench/opening side-wall and/or the floor, void-free filling of the trenches is achieved. Techniques herein include several methods by which the surface energy of the side-wall and/or floor can be improved. Such methods include surface treatments such as post-etch treatment with oxygen, nitrogen, hydrogen, and fluorine containing gases. Another treatment includes post etch wet cleans with dilute hydrofluoric acid (dHF), sulphuric peroxide (SPN), et cetera. Another treatment includes pre-applying treatment in a coater/developer system with solvents such as isopropyl alcohol, de-ionized water, tetramethylammonium hydroxide (TMAH), hexamethyldisilazane (HMDS), et cetera. Another option is forming conformal films such as by atomic layer deposition (ALD), chemical vapor deposition (CVD), direct current superposition, and so forth.

One cause of improper void fill performance of spin-on MeOx (metal oxide) materials is the mismatch between the surface energy of the trench surface (and/or floor surface) and the spin-on MeOx system. For example, if the spin-on MeOx material is hydrophilic, and if the surface of the trench (including the sidewalls and the floor) is hydrophobic, then the hydrophilic material will not wet the trench completely and thus will result in voids during the baking process.

As disclosed herein, careful matching of the surface energies enables void-free gap fill for the spin-on MeOx materials. There are many alternative embodiments. Some include post etch treatment in any plasma etch chamber or other treatment chamber using a single gas or a mixture of gases, post etch wet clean using specific chemical formulations, and pre applying treatment in a track tool (coater/developer tool) using specific solvents. Accordingly, techniques herein enable void-free and defect-free gap fill of several spin-on MeOx materials. Such filling techniques enable self-aligned block (SAB) integration for 5 nm BEOL trench patterning, for example.

Figure 4:
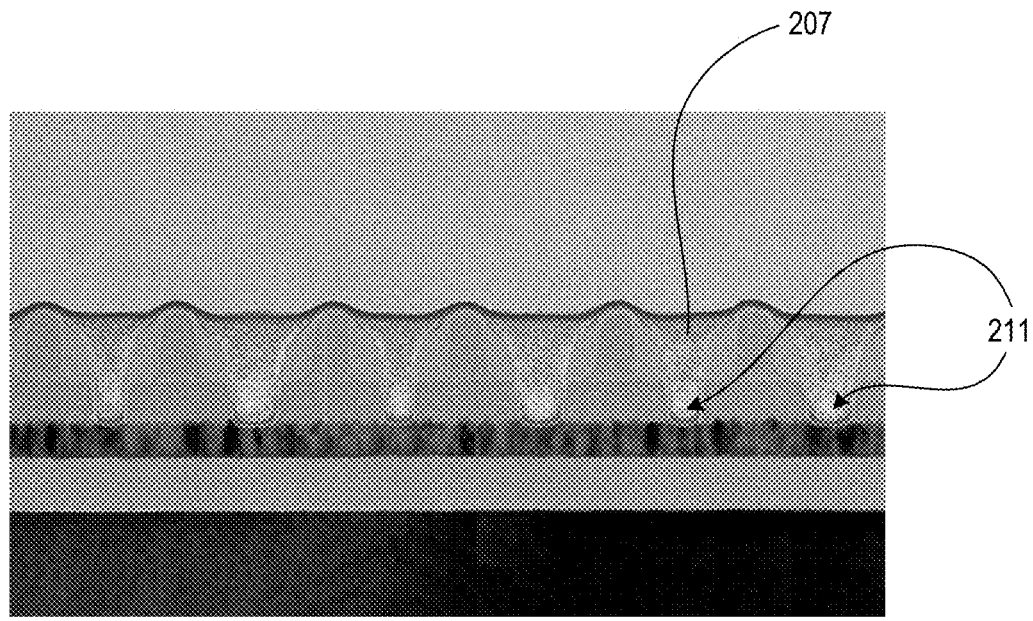
FIG. 4 is a magnified image of a substrate segment showing voids in a fill material.

FIG. 4 illustrates an example of the gap fill problem with conventional techniques. FIG. 4 is an enlarged image of a substrate segment that has openings filled by a metal oxide material 207. Note, however, that the deposition of metal oxide material 207 resulted in voids 211 at the bottom of openings being filled by the metal oxide.

Techniques herein include a method for depositing material on a substrate. A substrate is received or otherwise provided that has a relief pattern. The relief pattern defines openings that uncover an underlying layer. The relief pattern provides sidewall surfaces that define the openings. The underlying layer provides floor surfaces that define the openings. In other words, the relief pattern has trenches or holes or other openings that extend to an underlying layer. These trenches or openings have side surfaces and a bottom surface. The relief pattern provides the side surfaces, while a top surface of an underlying layer functions as a floor surface or bottom surface of a given hole or trench. In some embodiments, the relief pattern can define openings having critical dimensions less than 40 nanometers.

The sidewall surfaces have a first surface energy value, while the floor surfaces have a second surface energy value. These surface energy values of each material or surface can be different or identical depending on particular materials used. FIG. 1 illustrates an example substrate segment defining openings. Note that this substrate segment includes relief pattern 150 and underlying layer 135. Relief pattern 150 includes lines of two different materials. Letters "A" and "B" appear above these materials. The letter "C" appears above openings in the relief pattern. By way of a non-limiting example, the opening designated with the letter C can be trenches to be filled with a metal-containing material.

A fill material is identified or otherwise selected to fill the defined openings by being deposited on the substrate via spin-on deposition. Fill materials can include metal oxide or other metal-containing materials.

A surface energy modification treatment is executed. The surface energy modification treatment modifies at least one of the first surface energy value and the second surface energy value such that a contact angle value of an interface between the fill material in liquid form and the sidewall surfaces or the floor surfaces is less than 60 degrees. Such a surface energy modification treatment can thus target either the sidewall surfaces, the floor surfaces, or both. Depending on a type of energy modification treatment selected, the contact angle value of the interface between the fill material in liquid form and the sidewall surfaces can be less than 60 degrees or less than 30 degrees or less than 20 degrees.

Executing the energy modification treatment can include modifying the second surface energy value such that a contact angle value of an interface between the fill material in liquid form and the floor surfaces is less than 60 degrees, or less than 30 degrees, or less than 20 degrees, depending on a type of modification treatment executed.

Figure 2:
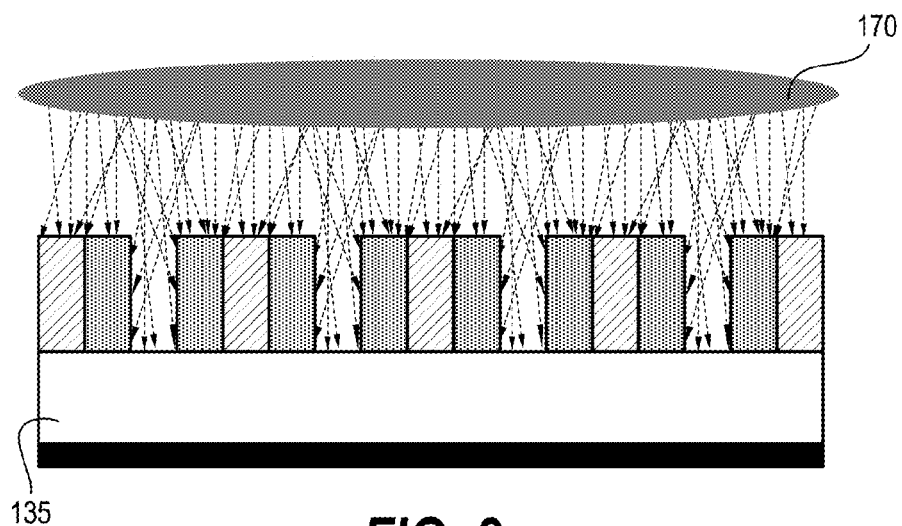
FIG. 2 is a cross-sectional schematic view of an example substrate segment showing surface modification according to embodiments disclosed herein.

Techniques herein provide several alternative treatments for modifying surface energies of surfaces to be filled. One example treatment is exposing the substrate to plasma products within a plasma processing system. FIG. 2 illustrates such an example treatment. A plasma 172 can be formed over a working surface of a substrate such that plasma products react with substrate surfaces or otherwise bombard substrate surfaces to change surface energies. Isotropic flow of plasma products is beneficial for modifying sidewall surfaces.

In another embodiment, a liquid-based modifier can be deposited on the relief pattern, which can react with or otherwise alter surfaces. Such a liquid-based treatment can include executing a post-etch wet clean. With particular cleaning chemicals selected based on relief pattern materials and underlying layer materials, the substrate can be simultaneously cleaned and modified.

Alternative modification techniques include depositing a conformal film on the relief pattern such as by atomic layer deposition, chemical vapor deposition, direct current superposition, or combinations thereof.

Figure 3:
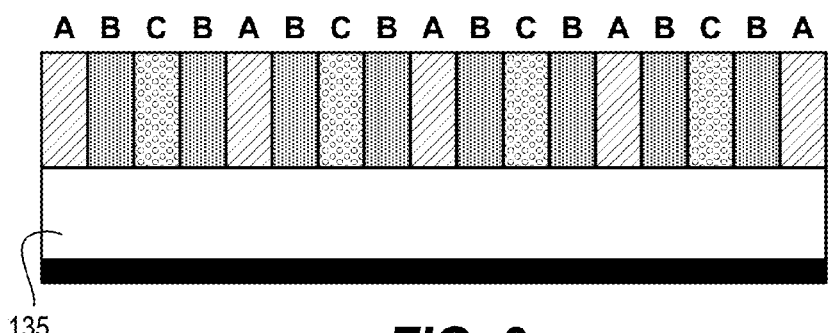
FIG. 3 is a cross-sectional schematic view of an example substrate segment showing a process flow according to embodiments disclosed herein.

Note that one or more modification treatments can be executed. In some fabrication techniques a first modification treatment can be used to modify sidewall surfaces, while a second modification treatment is used to modify floor surfaces. Also, two or more treatments can be executed to modify a given surface as desired. After one or more modification treatments have been executed, the fill material—which can be metal-containing—is deposited on the substrate via spin-on deposition. This deposition is executed such that the fill material fills the defined openings with the fill material being in contact with the sidewall surfaces and the floor surfaces. With surface energies being tuned to a given fill material, such deposition results in a void free filling. FIG. 3 illustrates an example result of a substrate segment after the fill operation and after an optional planarization step to remove any overburden of fill material.

Figure 5:
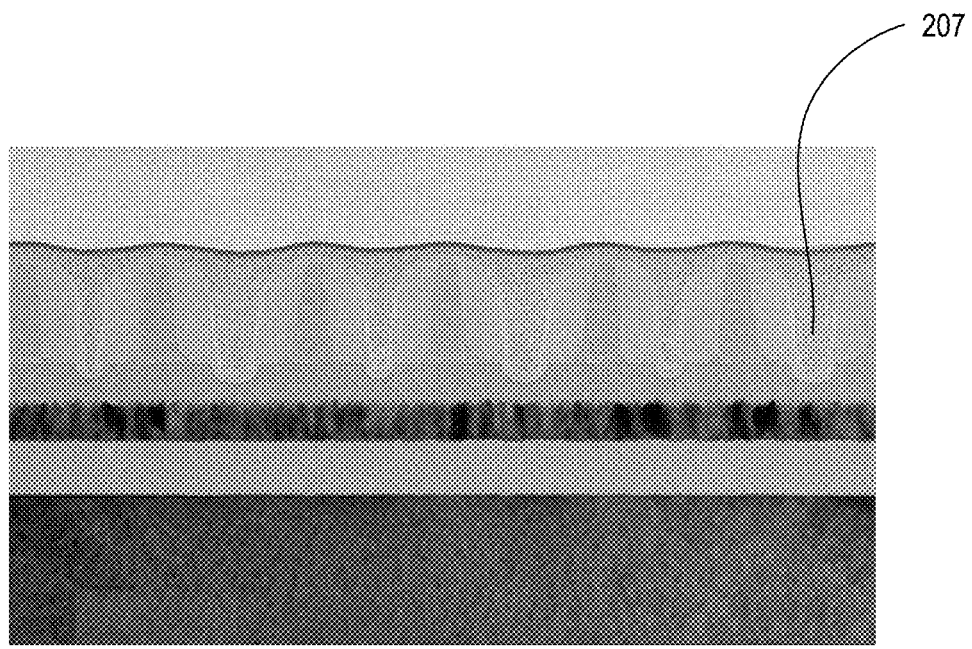
FIG. 5 is a magnified image of a substrate segment showing void-free filling according to techniques herein.

By way of a specific, non-limiting example, a low-temperature titanium oxide (TiOx) solvent system based on propanol (an alcohol) is deposited on a substrate. Prior to depositing this metal oxide, an oxidative post-etch treatment is executed as well as a wash with isopropyl alcohol. As shown in FIG. 5, the result is a void-free fill of metal oxide.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for depositing material on a substrate, the method comprising:
receiving a substrate having a relief pattern that defines openings that uncover an underlying layer, the relief pattern providing sidewall surfaces that define the openings, the underlying layer providing floor surfaces that define the openings, the sidewall surfaces having a first surface energy value, the floor surfaces having a second surface energy value;
identifying a fill material comprising a metal hard mask material to fill the defined openings by being deposited on the substrate via spin-on deposition;
executing a surface energy modification treatment, the surface energy modification treatment modifying at least one of the first surface energy value and the second surface energy value such that a contact angle value of an interface between the fill material in liquid form and the sidewall surfaces or the floor surfaces is less than 60 degrees; and
depositing the fill material on the substrate via spin-on deposition after executing the surface energy modification treatment such that the fill material fills the defined openings being in contact with the sidewall surfaces and the floor surfaces.

2. The method of claim 1, wherein executing the surface energy modification treatment includes modifying the first surface energy value such that the contact angle value of the interface between the fill material in liquid form and the sidewall surfaces is less than 60 degrees.

3. The method of claim 1, wherein executing the surface energy modification treatment results in the contact angle value of the interface between the fill material in liquid form and the sidewall surfaces is less than 30 degrees.

4. The method of claim 3, wherein executing the surface energy modification treatment results in the contact angle value of the interface between the fill material in liquid form and the sidewall surfaces is less than 20 degrees.

5. The method of claim 1, wherein executing the surface energy modification treatment includes modifying the second surface energy value such that the contact angle value of the interface between the fill material in liquid form and the floor surfaces is less than 60 degrees.

6. The method of claim 1, wherein executing the surface energy modification treatment results in the contact angle value of the interface between the fill material in liquid form and the floor surfaces is less than 30 degrees.

7. The method of claim 6, wherein executing the surface energy modification treatment results in the contact angle value of the interface between the fill material in liquid form and the floor surfaces is less than 20 degrees.

8. The method of claim 1, wherein executing the surface energy modification treatment includes exposing the substrate to plasma products within a plasma processing system.

9. The method of claim 1, wherein executing the surface energy modification treatment includes depositing a liquid-based modifier on the relief pattern.

10. The method of claim 9, wherein depositing the liquid-based modifier on the relief pattern includes executing a post-etch wet clean.

11. The method of claim 1, wherein executing the surface energy modification treatment includes depositing a conformal film on the relief pattern.

12. The method of claim 11, wherein executing the surface energy modification treatment includes executing a treatment selected from the group consisting of atomic layer deposition, chemical vapor deposition, and direct current superposition.

13. A method for depositing material on a substrate, the method comprising:
 receiving a substrate having a relief pattern that defines openings that uncover an underlying layer, the relief pattern providing sidewall surfaces that define the openings, the underlying layer providing floor surfaces that define the openings, the sidewall surfaces having a first surface energy value, the floor surfaces having a second surface energy value;
 identifying a fill material comprising to fill the defined openings by being deposited on the substrate via spin-on deposition;
 executing a surface energy modification treatment, the surface energy modification treatment modifying at least one of the first surface energy value and the second surface energy value such that a contact angle value of an interface between the fill material in liquid form and the sidewall surfaces or the floor surfaces is less than 60 degrees; and
 depositing the fill material on the substrate via spin-on deposition after executing the surface energy modification treatment such that the fill material fills the defined openings being in contact with the sidewall surfaces and the floor surfaces, wherein the relief pattern defines the openings having critical dimensions less than 40 nanometers.

14. A method for depositing material on a substrate, the method comprising:
 receiving a substrate having a relief pattern that defines openings that uncover an underlying layer, the relief pattern providing sidewall surfaces that define the openings, the underlying layer providing floor surfaces that define the openings, the sidewall surfaces having a first surface energy value, the floor surfaces having a second surface energy value;
 identifying a fill material comprising to fill the defined openings by being deposited on the substrate via spin-on deposition;
 executing a surface energy modification treatment, the surface energy modification treatment modifying at least one of the first surface energy value and the second surface energy value such that a contact angle value of an interface between the fill material in liquid form and the sidewall surfaces or the floor surfaces is less than 60 degrees; and
 depositing the fill material on the substrate via spin-on deposition after executing the surface energy modification treatment such that the fill material fills the defined openings being in contact with the sidewall surfaces and the floor surfaces, wherein depositing the fill material on the substrate includes using a deposition solvent system that matches the first surface energy value.

15. The method of claim 14, wherein depositing the fill material on the substrate includes using the deposition solvent system that matches the second surface energy value.

16. The method of claim 1, wherein the metal hardmask material comprises a metal oxide.

* * * * *